United States Patent
Moon et al.

(10) Patent No.: US 10,825,885 B2
(45) Date of Patent: Nov. 3, 2020

(54) DISPLAY APPARATUS HAVING A COMMON POWER SUPPLY WIRING IN THE PERIPHERAL

(71) Applicant: Samsung Display Co., Ltd., Yongin-si (KR)

(72) Inventors: Sangho Moon, Yongin-si (KR); Chungi You, Yongin-si (KR); Sungho Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/390,047

(22) Filed: Apr. 22, 2019

(65) Prior Publication Data

US 2020/0111857 A1     Apr. 9, 2020

(30) Foreign Application Priority Data

Oct. 5, 2018   (KR) .......................... 10-2018-0119315

(51) Int. Cl.
*H01L 27/32*     (2006.01)
*H01L 51/52*     (2006.01)

(52) U.S. Cl.
CPC ...... *H01L 27/3276* (2013.01); *H01L 27/3258* (2013.01); *H01L 51/5246* (2013.01)

(58) Field of Classification Search
CPC ............. H01L 27/3248; H01L 27/3258; H01L 27/3272; H01L 27/3276; H01L 27/3279
See application file for complete search history.

(56) References Cited

U.S. PATENT DOCUMENTS

| | | | |
|---|---|---|---|
| 7,868,320 B2 * | 1/2011 | Saito | G11C 5/025 257/40 |
| 8,829,495 B2 | 9/2014 | Kim et al. | |
| 9,153,631 B2 | 10/2015 | Sung et al. | |
| 9,741,783 B2 | 8/2017 | Cho et al. | |
| 9,825,253 B2 | 11/2017 | Cho et al. | |
| 2018/0033998 A1 | 2/2018 | Kim et al. | |

FOREIGN PATENT DOCUMENTS

| | | |
|---|---|---|
| KR | 1020150001012 A | 1/2015 |
| KR | 1020150026441 A | 3/2015 |
| KR | 1020150090474 A | 8/2015 |
| KR | 101701978 B1 | 1/2017 |
| KR | 1020180013452 A | 2/2018 |

* cited by examiner

*Primary Examiner* — Hoai V Pham
(74) *Attorney, Agent, or Firm* — Cantor Colburn LLP

(57) ABSTRACT

A display apparatus includes: a substrate including a display area and a peripheral area adjacent to the display area; a first and a second organic insulating layer each on the substrate; in the display area: a thin film transistor on the substrate; a driving voltage line connected to the thin film transistor and between the first and second organic insulating layers; and a display device connected to the thin film transistor, the first organic insulating layer and the second organic insulating layer being between the display device and the thin film transistor; and in the peripheral area, a common power supply wiring on the substrate and through which a common voltage is supplied to the display device in the display area. The common power supply wiring in the peripheral area and the driving voltage line in the display area are respectively portions of a same first material layer on the substrate.

20 Claims, 7 Drawing Sheets

DISPLAY APPARATUS HAVING A COMMON POWER SUPPLY WIRING IN THE PERIPHERAL

This application claims priority to Korean Patent Application No. 10-2018-0119315, filed on Oct. 5, 2018, and all the benefits accruing therefrom under 35 U.S.C. § 119, the disclosure of which is incorporated herein in its entirety by reference.

BACKGROUND

1. Field

One or more embodiments relate to a display apparatus.

2. Description of the Related Art

In accordance with the rapid development in display technology for visually expressing various kinds of electrical signal information, various flat display apparatuses having excellent characteristics such as a small thickness, a light weight, and low power consumption have been researched and developed. Among various display apparatuses, organic light-emitting display apparatuses do not use separate light sources, may be driven by low voltages, and may have a lightweight and thin structure. In addition, by having excellent characteristics in terms of viewing angle, contrast, and response speed, the organic light-emitting display apparatuses have attracted attention as next-generation display apparatuses.

SUMMARY

One or more embodiments include a display apparatus capable of reducing or effectively preventing an electrical short circuit between wirings, while reducing a peripheral area at which an image is not displayed.

Additional features will be set forth in part in the description which follows and, in part, will be apparent from the description, or may be learned by practice of the presented embodiments.

According to one or more embodiments, a display apparatus includes: a substrate including a display area and a peripheral area which is adjacent to the display area; a first organic insulating layer and a second organic insulating layer each on the substrate; in the display area: a thin film transistor on the substrate; a driving voltage line electrically connected to the thin film transistor, the driving voltage line between the first organic insulating layer and second organic insulating layer; and a display device electrically connected to the thin film transistor, the first organic insulating layer and the second organic insulating layer between the display device and the thin film transistor; and in the peripheral area, a common power supply wiring on the substrate and through which a common voltage is supplied to the display device in the display area. The common power supply wiring in the peripheral area and the driving voltage line in the display area are respectively portions of a same first material layer on the substrate.

The display apparatus may further include a driving circuit which is on the substrate and drives the display area, the driving circuit between the substrate and the first organic insulating layer.

An inner end portion of the common power supply wiring may be closest to the display area and between the first organic insulating layer and the second organic insulating layer.

The driving circuit may be between the substrate and the inner end portion of the common power supply wiring.

The display apparatus may further include: an encapsulation substrate arranged to face the substrate; and a sealing member in the peripheral area, the sealing member between the substrate and the encapsulation substrate. An outer end portion of the common power supply wiring may be furthest from the display area and disposed between the substrate and the sealing member.

The display apparatus may further include an auxiliary power supply wiring electrically connected to the common power supply wiring, the auxiliary power supply wiring between the substrate and the common power supply wiring.

The display apparatus may further include a data line between the substrate and the first organic insulating layer, and the auxiliary power supply wiring and the data line may be respectively portions of a same second material layer on the substrate.

An inner end portion of the auxiliary power supply wiring may be closest to the display area, an outer end portion of the auxiliary power supply wiring may be furthest from the display area, and the common power supply wiring may extend further than each of the inner end portion and the outer end portion of the auxiliary power supply wiring to cover the auxiliary power supply wiring.

The display apparatus may further include: an encapsulation substrate arranged to face the substrate; and a sealing member in the peripheral area, the sealing member between the substrate and the encapsulation substrate. An outer end portion of the common power supply wiring may be furthest from the display area and disposed between the substrate and the sealing member to directly contact the sealing member, and along a direction from the peripheral area to the display area, an entirety of the auxiliary power supply wiring may be between the sealing member and the display area.

The display apparatus may further include a first inorganic encapsulation layer, a second inorganic encapsulation layer, and an organic encapsulation layer which is between the first inorganic encapsulation layer and the second inorganic encapsulation layer. The first inorganic encapsulation layer and the second inorganic encapsulation layer may each extend from the display area to dispose outer end portions of the first inorganic encapsulation layer and the second inorganic encapsulation layer, respectively, in the peripheral area and in contact with each other.

The display apparatus may further include an outer end portion of the first organic insulating layer disposed furthest from the display area and a first partition on the substrate and spaced apart from the first organic insulating layer. Along a direction from the peripheral area to the display area, the outer end portion of the first inorganic encapsulation layer and the outer end portion of the second inorganic encapsulation layer may be disposed further from the display area than the first partition.

According to one or more embodiments, a display apparatus includes: a substrate including a display area and a peripheral area which is adjacent to the display area; an organic insulating layer on the substrate in each of the display area and the peripheral area thereof; in the display area: an organic light-emitting device on the substrate, and a pixel circuit which is on the substrate, the pixel circuit including a wiring which is electrically connected to the organic light-emitting device; and in the peripheral area: a common power supply wiring on the substrate and through which a common voltage is applied to the organic light-emitting device in the display area; and a driving circuit which is on the substrate and drives the display area, the driving circuit between the common power supply wiring and the pixel circuit along a direction from the peripheral area to the display area. In the peripheral area, the driving circuit is between the substrate and the organic insulating layer, and the common power supply wiring in the peripheral area and the wiring of the pixel circuit in the display area, are respectively portions of a same first material layer on the substrate.

An inner end portion of the common power supply wiring may be closest to the display area, and the organic insulating layer may be between the substrate and the inner end portion of the common power supply wiring.

The driving circuit may be disposed between the substrate and the inner end portion of the common power supply wiring.

The display apparatus may further include: an encapsulation substrate arranged to face the substrate; and a sealing member in the peripheral area, the sealing member between the substrate and the encapsulation substrate. An outer end portion of the common power supply wiring may be furthest from the display area and disposed between the substrate and the sealing member.

The display apparatus may further include an auxiliary power supply wiring electrically connected to the common power supply wiring, the auxiliary power supply wiring between the substrate and the common power supply wiring.

The driving circuit may include a thin film transistor including a source electrode and a drain electrode each in the display area, and the source electrode in the display area, the drain electrode in the display area and the auxiliary power supply wiring in the peripheral area may be respectively portions of a same second material layer on the substrate.

Along a direction from the peripheral area to the display area, an entirety of the auxiliary power supply wiring may be between the sealing member and the display area.

The display apparatus may further include a first inorganic encapsulation layer, a second inorganic encapsulation layer, and an organic encapsulation layer which is between the first inorganic encapsulation layer and the second inorganic encapsulation layer. The first inorganic encapsulation layer and the second inorganic encapsulation layer may each extend from the display area to dispose outer end portions of the first inorganic encapsulation layer and the second inorganic encapsulation layer, respectively, in the peripheral area and in contact with each other.

The display apparatus may further include an outer end portion of the organic insulating layer disposed furthest from the display area, and a first partition located on the substrate and spaced apart from the outer end portion of the organic insulating. Along a direction from the peripheral area to the display area, the outer end portion of the first inorganic encapsulation layer and the outer end portion of the second inorganic encapsulation layer may be disposed further from the display area than the first partition.

Other characteristics, and advantages in addition to the descriptions will become apparent hereinafter from the following drawings, claims, and detailed description.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
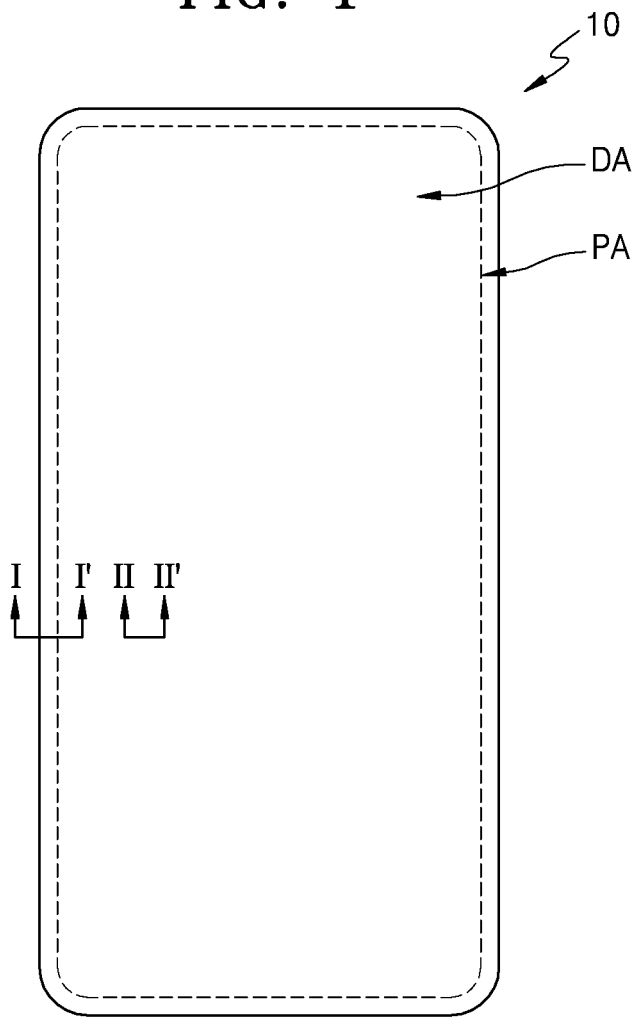
FIG. 1 is a top-plan view schematically illustrating an embodiment of a display apparatus.

As the present disclosure allows for various changes and numerous embodiments, particular embodiments will be illustrated in the drawings and described in detail in the written description. The advantages and features of the present disclosure and methods of achieving the advantages and features will be more clearly understood with reference to the accompanying drawings, in which example embodiments of the present disclosure are shown in detail. The present disclosure may, however, be embodied in various forms and will not be construed as limited to the embodiments set forth herein.

It will be understood that, although the terms "first," "second" and the like may be used herein to distinguish one element from another element, not in a limited sense.

As used herein, the singular forms "a," "an" and "the" are intended to include the plural forms as well, unless the context clearly indicates otherwise.

It will be further understood that the terms "comprises" and/or "comprising," when used in embodiments, specify the presence of stated features or elements, but do not preclude the addition of one or more other features or elements.

In embodiments, it will be understood that when a layer, a region, or a component is referred to as being related to another layer such as being "on" another layer, region, or component, the layer, region, or component may be directly on the other layer, region, or the component, or an intervening layer, region, or component may be present therebetween. In contrast, when a layer, a region, or a component is referred to as being related to another layer such as being "directly on" another layer, region, or component, the layer, region, or component is on the other layer, region, or the component with no intervening layer, region, or component present therebetween.

Sizes of components in the drawings may be exaggerated or reduced for convenience of explanation. In other words, since sizes and thicknesses of components in the drawings are arbitrarily illustrated for convenience of explanation, the present disclosure is not limited thereto.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

When a certain embodiment may be differently implemented, a specific process order may be performed differently from the described order. For example, two consecutively described processes may be performed substantially at the same time or performed in an order opposite to the described order.

Reference will now be made in detail to embodiments, examples of which are illustrated in the accompanying drawings. In the drawings, same or corresponding elements are denoted by the same reference numerals. As used herein, the term "and/or" includes any and all combinations of one or more of the associated listed items. Expressions such as "at least one of," when preceding a list of elements, modify the entire list of elements and do not modify the individual elements of the list.

On the top surface of display apparatuses, elements such as physical buttons are being removed and display areas for displaying images are being enlarged. Thus, research on reducing a peripheral area, which is an area that does not display images (e.g., non-display area), is continually being performed.

Figure 2:
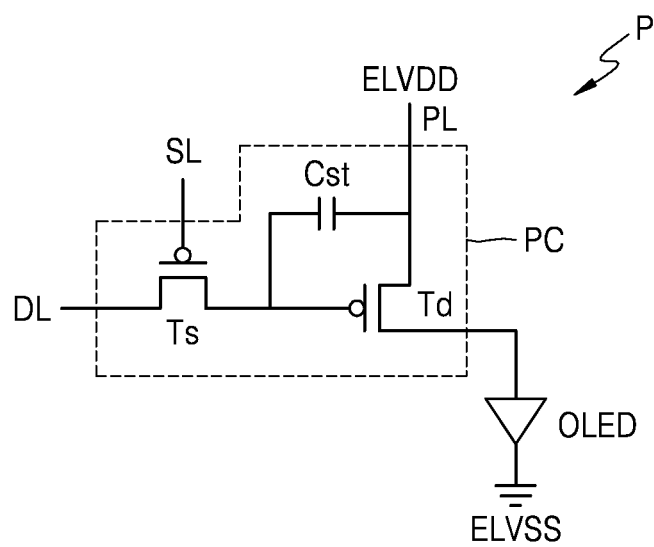
FIG. 2 is an equivalent circuit diagram of an embodiment of a pixel in a display apparatus.

FIG. 1 is a top-plan view schematically illustrating an embodiment of a display apparatus 10; FIG. 2 is an equivalent circuit diagram of an embodiment of a pixel in the display apparatus; and FIG. 3 is an enlarged cross-sectional view schematically illustrating an embodiment of cross-sections respectively taken along lines I-I' and II-II' shown in FIG. 1.

Figure 3:
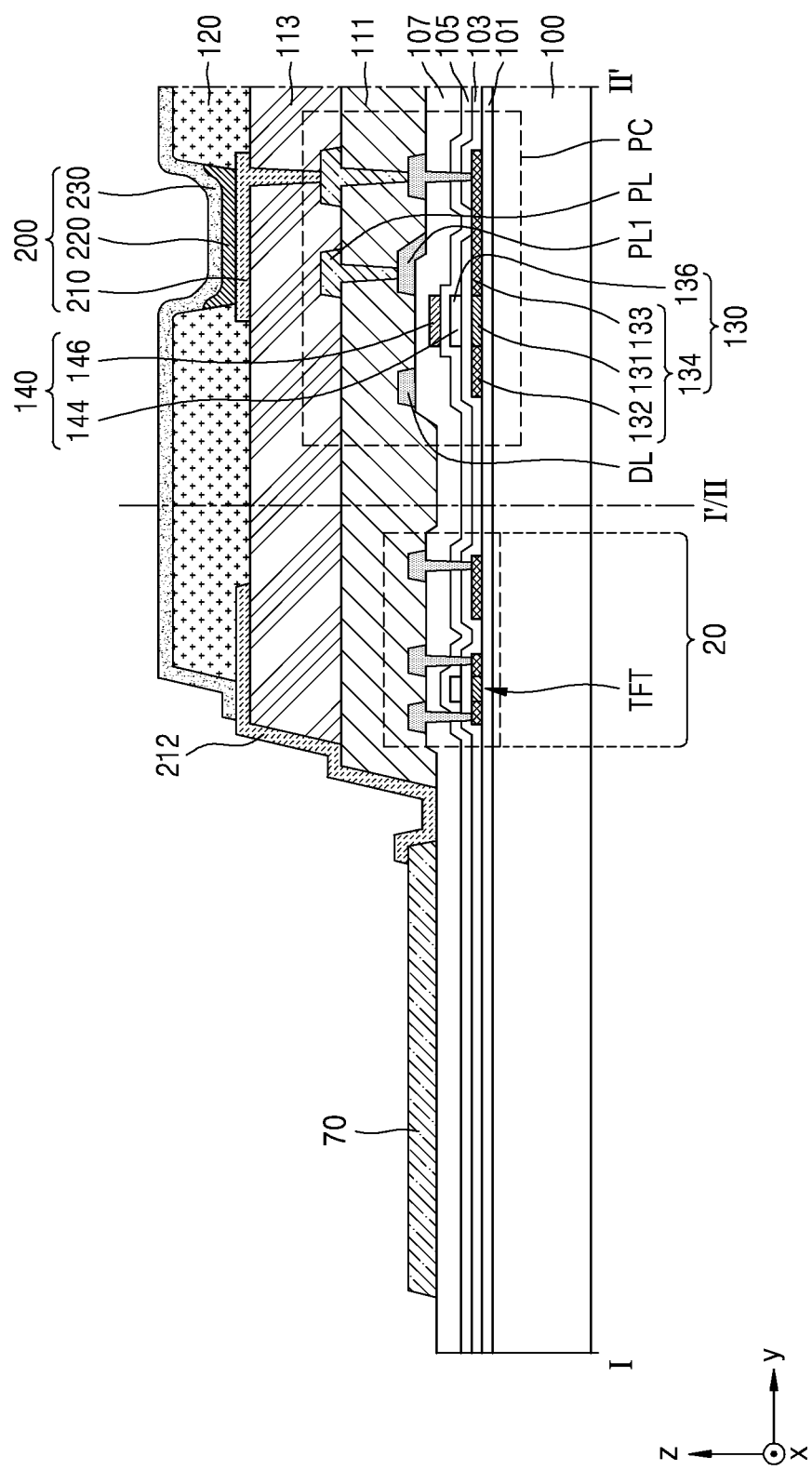
FIG. 3 is an enlarged cross-sectional view schematically illustrating an embodiment of the display apparatus taken along line I-I' and line I-II' shown in FIG. 1.

Referring to FIGS. 1 through 3, the display apparatus 10 includes a display area DA in which an image is displayed, and a peripheral area PA which is adjacent to the display area, such as being placed around the display area DA. It is also understood that components within the display apparatus 10, such as a substrate 100 thereof, also include a display area DA and a peripheral area PA corresponding to those of the display apparatus 10 overall.

The display apparatus 10 and components thereof may be disposed in a plane defined by a first direction and a second direction which cross each other. In FIG. 1, for example, the horizontal direction may represent one of the first direction (e.g., y-axis direction) or the second direction (e.g., an x-axis direction), and the vertical direction represents the other of the first direction and the second direction. A thickness of the display apparatus 10 and components thereof may extend along a third direction (e.g., a z-axis direction) which crosses each of the first direction and the second direction. In FIG. 3, for example, the vertical direction represents the third direction.

A pixel P is provided in plurality in the display area DA. FIG. 2 illustrates an equivalent circuit diagram of an embodiment of the pixel P. Referring to FIG. 2, the pixel P may include a pixel circuit PC connected to signals lines such as a scan line SL and a data line DL, and a display device 200 which is connected to the pixel circuit PC. The display device 200 may, for example, include an organic light-emitting device. The display device 200 which is connected to the pixel circuit PC may be driven or controlled by the pixel circuit PC to generate and/or display an image. The display device 200 which is connected to the pixel circuit PC may be driven or controlled by the pixel circuit PC to generate light with which an image is displayed. One or more of these components may be provided in plurality within the display apparatus 10.

The pixel circuit PC may include a driving thin film transistor Td, a switching thin film transistor Ts, and a storage capacitor Cst. The switching thin film transistor Ts is connected to the scan line SL and the data line DL and may, in response to a scan signal input via the scan line SL, deliver a data signal input via the data line DL to the driving thin film transistor Td. The storage capacitor Cst, which is connected to the switching thin film transistor Ts and a driving power line PL, may store a voltage corresponding to a gap between a voltage received from the switching thin film transistor Ts and a driving voltage ELVDD supplied to and through the driving voltage line PL.

The driving thin film transistor Td may be connected to the driving voltage line PL and the storage capacitor Cst and may, in response to a value of the voltage stored in the storage capacitor Cst, control an electrical driving current flowing from the driving voltage line PL to the organic light-emitting device OLED. The organic light-emitting device may emit light having a certain luminance by the driving current. The organic light-emitting device may, for example, emit red, green, blue, and/or white light.

An embodiment in which the pixel P includes two thin film transistors and one storage capacitor is described with reference to FIG. 2, but the present disclosure is not limited thereto. In other embodiments, the pixel circuit PC of the pixel P may be variously modified, for example, to include at least three thin film transistors or at least two storage capacitors.

Hereinafter, a structure of the pixel P will be described in detail with reference to FIG. 3. The pixel circuit PC and the display device 200 of the pixel P are above the substrate 100.

The substrate 100 may include various materials such as glass, metal, or plastic such as polyethylene terephthalate ("PET"), polyethylene naphthalate ("PEN"), and polyimide.

A buffer layer 101 may be disposed or formed on the substrate 100. The buffer layer 101 may block an undesirable foreign material or moisture which permeates through the substrate 100. In an embodiment, for example, the buffer layer 101 may include an inorganic material such as silicon oxide (SiOx), silicon nitride (SiNx), and/or silicon oxynitride, and may include a single layer structure (e.g., monolayer) or a multi-layer structure. The buffer layer 101 may be disposed or formed to correspond to the display area DA and the peripheral area PA.

The display area DA of the substrate 100 may include a thin film transistor 130, a storage capacitor 140, and the display device 200 electrically connected to the thin film transistor 130 and to the storage capacitor 140. In an embodiment, for example, the display device 200 may include an organic light-emitting device OLED. In addition, the thin film transistor 130 in FIG. 3 may correspond to the driving thin film transistor Td (see FIG. 2) provided in the pixel circuit PC, and the storage capacitor 140 corresponds to the storage capacitor Cst (see FIG. 2) described with reference to FIG. 2.

The thin film transistor 130 includes a semiconductor layer 134 and a gate electrode 136. The semiconductor layer 134 may, for example, include polysilicon. The semiconductor layer 134 may include a channel area 131 under the gate electrode 136, and a source area 132 and a drain area 133 which are respectively located at opposite sides of the channel area 131 and doped with an impurity having a greater concentration than that of the channel area 131. Here, the impurity may include an N-type impurity or a P-type impurity. For another example, the semiconductor layer 134 may include amorphous silicon or an organic semiconductor material. For another example, the semiconductor layer 134 may include an oxide semiconductor layer.

The source area 132 and the drain area 133 may respectively be connected to a source electrode and a drain electrode of the thin film transistor 130. Referring to FIG. 3, for example, a drain electrode of the thin film transistor 130 is shown contacting the drain area 133, without being limited thereto. The source electrode and the drain electrode of the thin film transistor 130 may respectively be disposed or formed in a same layer as that of the data line DL. As elements are in a same material layer, the elements may respectively be portions of a same material layer on the substrate 100 and/or formed in a same manufacturing process from a same material layer on the substrate 100.

The pixel circuit PC may further include the switching thin film transistor Ts (see FIG. 2) as described with reference to FIG. 2. In addition, the semiconductor layer 134 of the thin film transistor 130 and a semiconductor layer of the switching thin film transistor Ts (see FIG. 2) may include different materials, respectively. In an embodiment, for example, one of the semiconductor layer 134 in the thin film transistor 130 and the semiconductor layer of the switching thin film transistor Ts (see FIG. 2) may include an oxide semiconductor, and another one may include polysilicon.

A gate insulating layer 103 may be located between the semiconductor layer 134 and the gate electrode 136. The gate insulating layer 103 may include an inorganic insulating layer such as silicon oxynitride (SiON), and/or silicon nitride (SiNx), and the inorganic insulating layer may be a single layer structure or a multi-layer structure.

The storage capacitor 140 includes a lower electrode 144 and an upper electrode 146 which overlaps the lower electrode 144. A first interlayer insulating layer 105 may be located between the lower electrode 144 and the upper electrode 146.

The first interlayer insulating layer 105, which is a layer having a permittivity, may include an inorganic insulating layer such as SiON, SiOx, and/or SiNx and may include a single layer structure or a multi-layer structure. FIG. 3 illustrates the storage capacitor 140 overlapping the thin film transistor 130 and the lower electrode 144 is the gate electrode 136 of the thin film transistor 130, but the present disclosure is not limited thereto. In another embodiment, the storage capacitor 140 may not overlap the thin film transistor 130 and the lower electrode 144 may be a component independent from the gate electrode 136 of the thin film transistor 130.

The storage capacitor 140 may be covered by a second interlayer insulating layer 107. The second interlayer insulating layer 107 may include an inorganic insulating layer such as SiON, SiOx, and/or SiNx and may include a single layer structure or a multi-layer structure.

The driving voltage line PL may be on a first organic insulating layer 111. The driving voltage line PL, which includes aluminum (Al), copper (Cu), titanium (Ti), and the like, may include a multi-layer structure or a single layer structure. In an embodiment, for example, the driving voltage line PL may include a multi-layer structure of Ti/Al/Ti.

In FIG. 3, a lower driving voltage line PL1 under the first organic insulating layer 111 is further provided. The lower driving voltage line PL1, which is electrically connected to the driving voltage line PL via a contact hole penetrating through the first organic insulating layer 111, may reduce or effectively prevent a voltage drop of the driving voltage ELVDD supplied through the driving voltage line PL. The lower driving voltage line PL1 may include the same material as that of the data line DL and/or disposed in a same layer thereof. In an embodiment, for example, the lower driving voltage line PL1 and the data line DL may include Al, Cu, Ti, and the like and may be disposed or formed as a multi-layer structure or a single layer structure. In an embodiment, the lower driving voltage line PL1 and the data line DL may include a multi-layer structure such as Ti/Al/Ti or TiN/Al/Ti.

The first organic insulating layer 111 includes an organic insulating material. The organic insulating material may include a polymer such as poly(methyl methacrylate) ("PMMA") or polystyrene ("PS"), a polymer derivative having a phenol group, an acryl-based polymer, an aryl ether-based polymer, an amide-based polymer, a fluorine-based polymer, a p-xylene based polymer, a vinyl alcohol-based polymer, and a combination thereof. In an embodiment, for example, the first organic insulating layer 111 may include polyimide.

The driving voltage line PL is covered by a second organic insulating layer 113. The second organic insulating layer 113 may include an imide-based polymer, a polymer such as PMMA or PS, a polymer derivative having a phenol group, an acryl-based polymer, an aryl-ether based polymer, an amide-based polymer, a fluorine-based polymer, a p-xylene polymer, a vinyl alcohol-based polymer, and a combination thereof. In an embodiment, for example, the second organic insulating layer 113 may include polyimide.

A pixel electrode 210 is on the second organic insulating layer 113. A pixel defining layer 120 is on the pixel electrode 210. The pixel defining layer 120 may define a light emission area by including an opening corresponding to a pixel P of the display apparatus 10. The opening defined by portions of the pixel defining layer 120 exposes at least a center portion of the pixel electrode 210. In addition, the pixel defining layer 120 may increase a distance between an outer edge of the pixel electrode 210 and a common electrode 230 along a thickness of the display apparatus 10, thereby reducing or effectively preventing an electrical arc and so on from being formed between the outer edge of the pixel electrode 210 and the common electrode 230. The pixel defining layer 120 may include an organic material, for example, such as polyimide or hexamethyldisiloxane.

The intermediate layer 220 may include a relatively low molecular weight material or a relatively high molecular weight material. When including the relatively low molecular weight material, the intermediate layer 220 may include a structure in which a hole injection layer ("HIL"), a hole transport layer ("HTL"), an emission layer ("EML"), an electron transport layer ("ETL"), an electron injection layer ("EIL"), and the like are stacked. The intermediate layer 220 may include various organic materials such as copper phthalocyanine (CuPc), N,N'-Di(naphthalene-1-yl)-N,N'-diphenyl-benzidine ("NPB"), tris-8-hydroxyquinoline aluminum (A1Q3). In an embodiment of a method of manufacturing a display apparatus, the above-mentioned layers may be formed in a vacuum deposition method.

When the intermediate layer 220 includes a relatively high molecular weight material, the intermediate layer 220 may have a structure including an HTL and an EML. The HTL may include poly(3,4-ethylenedioxythiophene) ("PEDOT") and the EML may include a relatively high molecular weight material such as a poly-phenylenevinylene ("PPV")-based material or a polyfluorene-based material. Structures of the intermediate layer 220 are not limited to the above-described embodiments and the intermediate layer 220 may have various structures. In an embodiment, for example, at least one of the above-mentioned layers included in the intermediate layer 220 may be integrally formed across a plurality of the pixel electrode 210. That is, one of the above-mentioned layers included in the intermediate layer 220 may be commonly disposed relative to each of a plurality of the pixel electrode 210. Alternatively, the intermediate layer 220 may include layers that are patterned to respectively correspond to the plurality of the pixel electrode 210.

The common electrode 230, which is in the display area DA, may be arranged to cover the display area DA. In other words, the common electrode 230 may be integrally formed to cover a plurality of the pixel P, so as to be commonly disposed relative to each of the plurality of the pixel P.

The peripheral area PA of the substrate 100 is located outside the display area DA. That is, the peripheral area PA may surround the display area DA. The peripheral area PA, in which a plurality of the pixel P is not arranged, is a non-display area at which an image is not provided. The peripheral area PA includes a pad area (not shown), to which various electronic devices and/or printed circuit boards external to the substrate 100 are electrically attached. A driving circuit 20, a common power supply wiring 70, and the like may be in the peripheral area PA.

The driving circuit 20 may deliver various kinds of driving signals and/or control signals to the display area DA. The driving circuit 20 drives the display area DA with the driving signals and/or control signals provided thereto. The driving circuit 20 may include an emission driving circuit, a scan driving circuit, and the like. The driving circuit 20 may further include a thin film transistor TFT and a wiring (not shown) which is connected to the thin film transistor TFT. The thin film transistor TFT and the wiring may be provided in plurality within the peripheral area PA. Elements or layers of the thin film transistor TFT included in the driving circuit 20 may be manufactured in a same process as elements or layers of the thin film transistor 130 of the pixel circuit PC. Accordingly, the driving circuit 20 includes insulating layers located between elements (for example, a semiconductor layer, a gate electrode, a source electrode, a drain electrode, and the like) in the thin film transistor TFT. Referring to FIG. 3, for example, the source electrode and the drain electrode of the thin film transistor TFT may respectively be disposed or formed in a same layer as that of the data line DL, without being limited thereto. In an embodiment, for example, the gate insulating layer 103, the first interlayer insulating layer 105, and the second interlayer insulating layer 107 may extend from the display area DA to the peripheral area PA and form insulating layers in the peripheral area PA and the thin film transistor TFT therein.

The common power supply wiring 70 may include a same material as that of the driving voltage line PL. In an embodiment, for example, the common power supply wiring 70 may have a multi-layer structure including Ti/Al/Ti and be located on the second interlayer insulating layer 107.

An outer end portion of the common power supply wiring 70 is disposed furthest from the display area DA. An inner end portion of the common power supply wiring 70 is disposed closest to the display area DA and may be covered by a conductive layer 212. The conductive layer 212 includes a same material as that of the pixel electrode 210 and may be connected to the common electrode 230. The conductive layer 212 may be disposed in a same layer as that of the pixel electrode 210. In another embodiment, the inner end of the common power supply wiring 70 may extend from the peripheral area PA toward the display area DA, to be disposed in the display area DA and directly contact the common electrode 230.

The driving circuit 20, which is adjacent to the common power supply wiring 70, may not include a component located in a same layer as that of the driving voltage line PL. In an embodiment, for example, the emission driving circuit and the scan driving circuit that are included in the driving circuit 20 may not include components located on the first organic insulating layer 111. Referring to FIG. 3, for example, the driving circuit 20 is illustrated including components in same layers as the semiconductor layer 134, the data line DL and the lower driving voltage line PL1 in the thin film transistor 130. However, there are no components of the driving circuit 20 above the first organic insulating layer 111.

The above-described components may be hereinafter referred to as a wiring which is electrically conductive. Accordingly, as the common power supply wiring 70 includes a same material and/or is disposed in a same layer as that of the driving voltage line PL located on the first organic insulating layer 111 in the pixel circuit PC and may be simultaneously formed with the driving voltage line PL, the danger of an electrical short circuit between the common power supply wiring 70 and another wiring included in the driving circuit 20 between the common power supply wiring 70 and the pixel circuit PC along the y-axis direction, may be efficiently reduced or effectively prevented.

Figure 4:
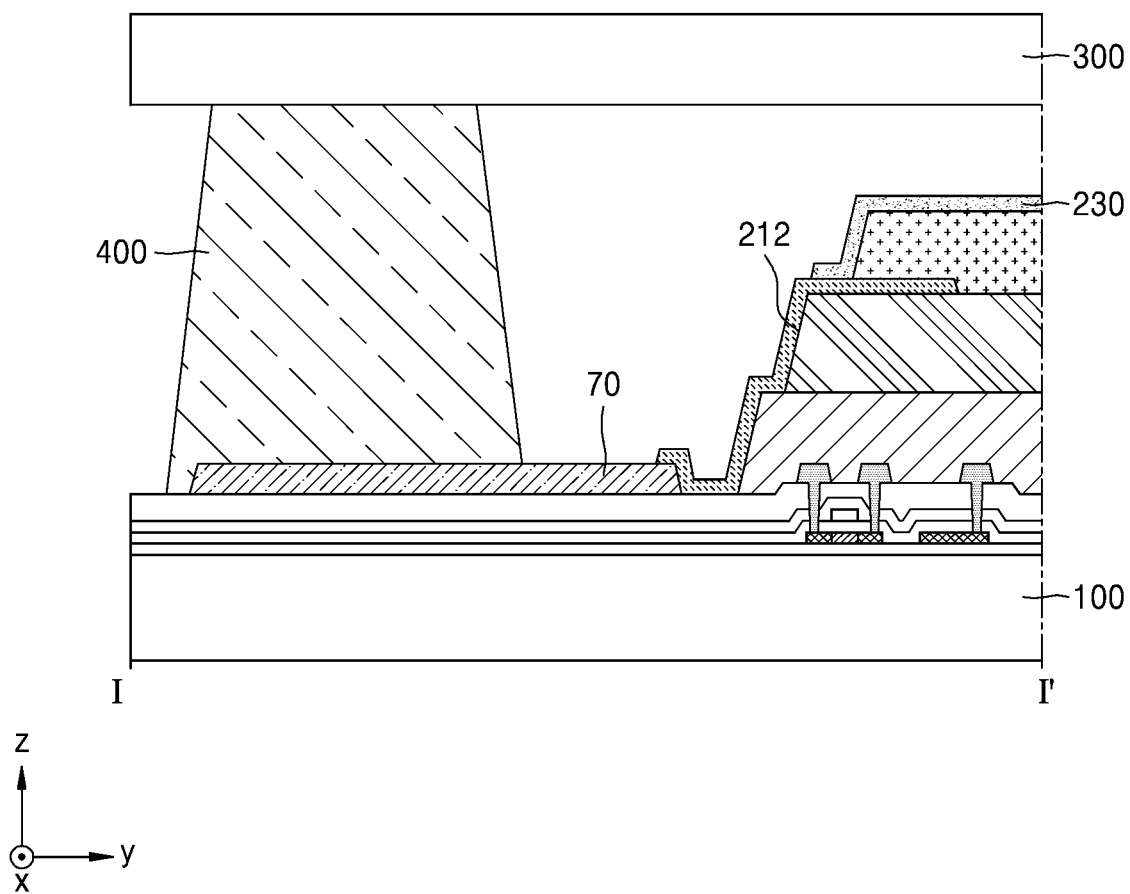
FIG. 4 is an enlarged cross-sectional view schematically illustrating another embodiment of the display apparatus taken along line I-I' shown in FIG. 1.

FIG. 4 is a cross-sectional view schematically illustrating another embodiment of the display apparatus along the line I-I' of FIG. 1. In FIG. 4, for convenience of explanation, descriptions overlapping those of FIG. 3 will be omitted, and only differences between FIGS. 3 and 4 will be described.

Referring to FIG. 4, the display apparatus 10 (see FIG. 1) may further include an encapsulation substrate 300 and a sealing member 400.

The encapsulation substrate 300 is located opposite the substrate 100, and the sealing member 400 is located between the substrate 100 and the encapsulation substrate 300. The sealing member 400 may surround the display area DA (see FIG. 1) in a top-plan view as illustrated in FIG. 1. A volume defined by the substrate 100, the encapsulation substrate 300, and the sealing member 400 may be spatially separated from outside the display apparatus 10 (e.g., to the left of the sealing member 400 in FIG. 4) and reduce or effectively prevent permeation of moisture or impurities from the outside to an inside of the display apparatus 10 (e.g., to the right of the sealing member 400. A filler (not shown) may be located between the common electrode 230 and the encapsulation substrate 300. The filler (not shown) may, for example, include at least one of a photocurable epoxy-based material or an acrylate-based material, but the present disclosure is not limited thereto.

The encapsulation substrate 300 may include a transparent material. In an embodiment, for example, the encapsulation substrate 300 may include various materials such as glass, or plastic such as PET, PEN, and polyimide. The substrate 100 and the encapsulation substrate 300 may include a same material or different materials from each other.

The sealing member 400 bonds the substrate 100 and the encapsulation substrate 300 to each other and spatially separates the volume defined by the substrate 100, the encapsulation substrate 300, and the sealing member 400 from outside the display apparatus 10. The sealing member 400 may include frit, epoxy, and the like. The frit may be understood as a paste including a material such as SiO2, further including an absorption material for absorption of a laser or an infrared ray, an organic binder, a filler for reducing the coefficient of thermal expansion, and the like. In an embodiment of a method of manufacturing a display apparatus, through drying and plasticity processes, an organic binder and moisture may be removed from the frit in a paste state and thus the frit may be cured. The absorption material absorbing a laser or an infrared ray may include a transition metal compound. The frit is cured by a laser, or the like, to form the sealing member 400.

The sealing member 400 may cover an outer end portion of the common power supply wiring 70, include a side surface thereof, and directly contact a portion of the common power supply wiring 70 in an overlapping manner. Accordingly, compared to an entirety of the sealing member 400 located outside the common power supply wiring 70, a peripheral area of the display apparatus 10 (see FIG. 1) may be reduced. An inner end portion of the common power supply wiring 70 may be covered by the conductive layer 212 that is connected to the common electrode 230.

Figure 5:
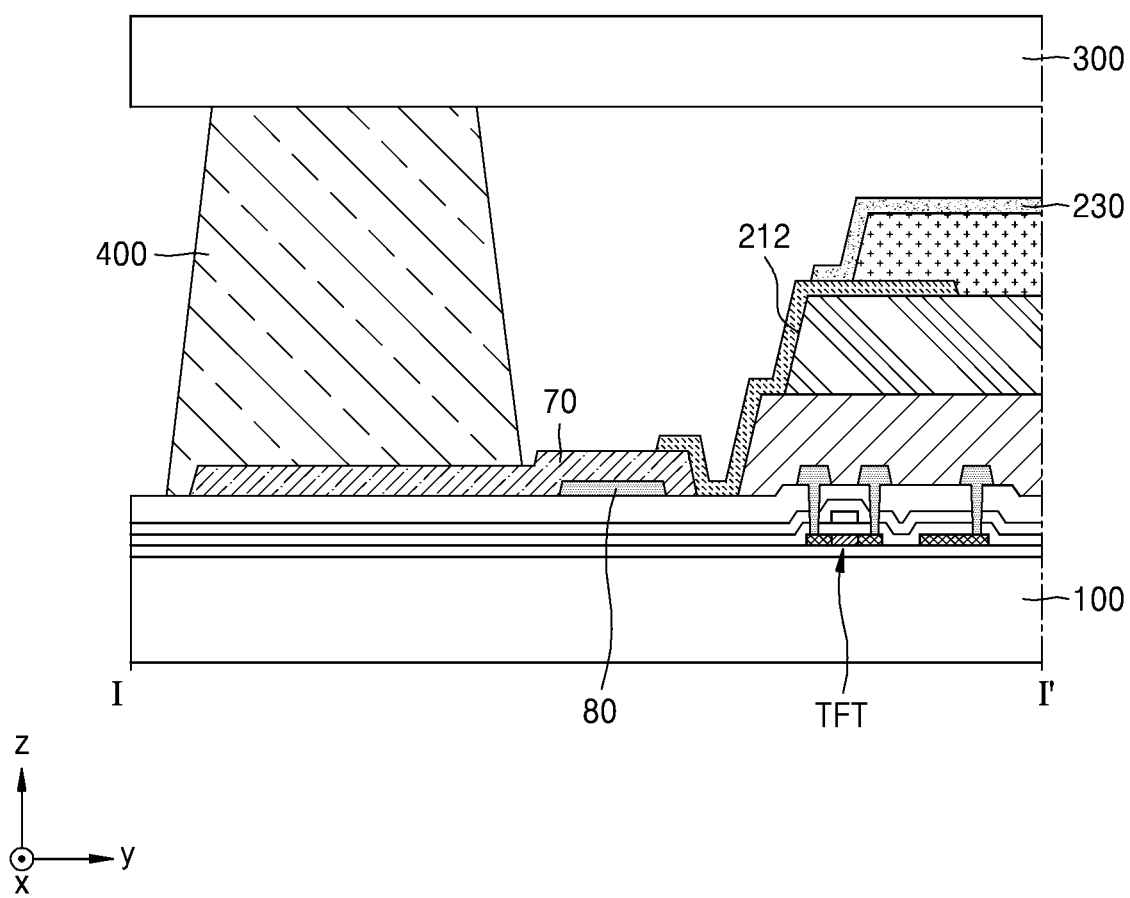
FIG. 5 is an enlarged cross-sectional view schematically illustrating still another embodiment of the display apparatus taken along line I-I' shown in FIG. 1.

FIG. 5 is a cross-sectional view schematically illustrating still another embodiment of the display apparatus along the line I-I' of FIG. 1.

Configurations as shown in FIG. 5 that the encapsulation substrate 300 is arranged to face the substrate 100, the sealing member 400 is between the substrate 100 and the encapsulation substrate 300, the outer end portion of the common power supply wiring 70 is covered by the sealing member 400, and the inner end portion of the common power supply wiring 70 is covered by the conductive layer 212 are identical to the configurations illustrated and described with reference to FIG. 4.

FIG. 5 is different from FIG. 4 in that an auxiliary power supply wiring 80 is further included under the common power supply wiring 70. The auxiliary power supply wiring 80 may be electrically connected to the common power supply wiring 70. Here, "to be electrically connected" includes structures in which the auxiliary power supply wiring 80 as a whole directly contacts the common power supply wiring 70, an insulating layer is between the auxiliary power supply wiring 80 and the common power supply wiring 70, and the auxiliary power supply wiring 80 and the common power supply wiring 70 are connected to each other via a contact hole in such insulating layer. Where the auxiliary power supply wiring 80 is electrically connected to the common power supply wiring 70, an electrical resistance of the common power supply wiring 70 may be reduced, and a voltage drop of a common voltage ELVSS (see FIG. 2) applied to the common electrode 230 may be reduced or effectively prevented.

The auxiliary power supply wiring 80 may include a same material as that of the source electrode and the drain electrode of the thin film transistor included in the driving circuit 20 (see FIG. 3) and be in a same layer as that of the source electrode and the drain electrode of the thin film transistor TFT included in the driving circuit 20. In addition, the auxiliary power supply wiring 80 has a width less than that of the common power supply wiring 70. Referring to FIG. 3, for example, the width may be defined along the y-axis direction. That is, an outer end portion and an inner end portion of the auxiliary power supply wiring 80, which are arranged opposite to each other along a direction of the width of the auxiliary power supply wiring 80, may be covered by the common power supply wiring 70. Accordingly, when the auxiliary power supply wiring 80 is further included, generating an electrical short circuit between the common power supply wiring 70 electrically connected to the auxiliary power supply wiring 80, and another wiring included in the driving circuit 20 between the common power supply wiring 70 and the pixel circuit PC along the y-axis direction, may be efficiently reduced or effectively prevented. Instead, the electrical resistance of the common power supply wiring 70 may be reduced by including the auxiliary power supply wiring 80, and the width of the common power supply wiring 70 may be decreased. Accordingly, the peripheral area in the display apparatus 10 (see FIG. 1) may be further reduced.

The auxiliary power supply wiring 80 is located only inside of the sealing member 400 and thus may not overlap the sealing member 400. In other words, along a direction from the peripheral area PA to the display area DA, an entirety of the auxiliary power supply wiring 80 is between the sealing member 400 and the display area DA. Accordingly, as no height difference is caused in an area of the common power supply wiring 70 which overlaps the sealing member 400, the sealing member 400 on the common power supply wiring 70 may have a uniform height, and thus, when forming the sealing member 400 by irradiating a laser and the like, the sealing member 400 may be formed to have a uniform bonding strength.

Figure 6:
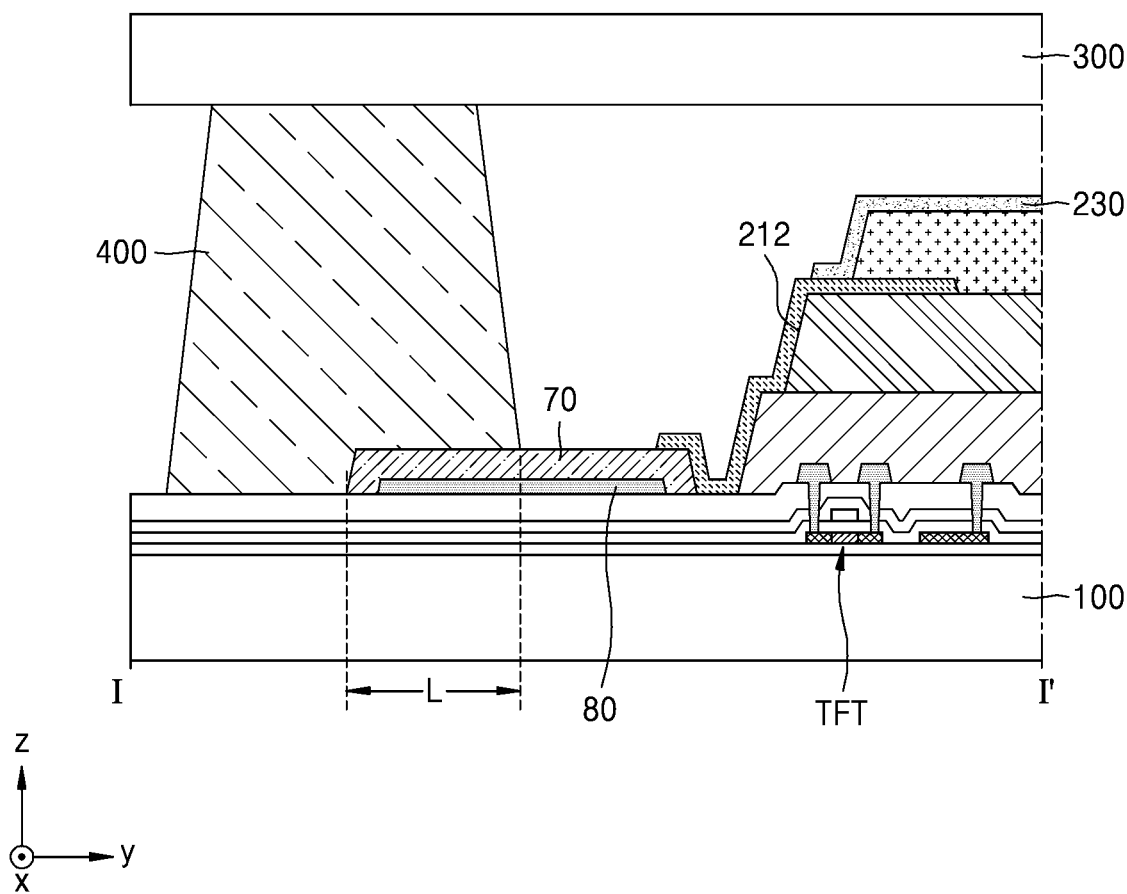
FIG. 6 is an enlarged cross-sectional view schematically illustrating a modified embodiment of the display apparatus taken along line I-I' shown in FIG. 1.

FIG. 6 is an enlarged cross-sectional view schematically illustrating a modified embodiment of the display apparatus along the line I-I' of FIG. 1.

As shown in FIG. 6, the substrate 100 and the encapsulation substrate 300 that are arranged to face each other may be bonded to each other by the sealing member 400, the outer end portion of the common power supply wiring 70 may be covered by the sealing member 400, and the inner end portion of the common power supply wiring 70 may be covered by the conductive layer 212 that contacts the common electrode 230. In addition, a configuration that the auxiliary power supply wiring 80 is further located under the common power supply wiring 70 is identical to the configuration illustrated and described with reference to FIG. 5. In other words, the auxiliary power supply wiring 80, which is electrically connected to the common power supply wiring 70, may include a same material as that of the source electrode and the drain electrode of the thin film transistor TFT included in the driving circuit 20 (see FIG. 3) and may be located in a same layer as that of the source electrode and the drain electrode of the thin film transistor TFT included in the driving circuit 20 (see FIG. 3).

The auxiliary power supply wiring 80 shown in FIG. 6 may extend to a position at which the sealing member 400 overlaps the auxiliary power supply wiring 80. As a result, the electrical resistance of the common power supply wiring 70 is further reduced. Accordingly, a width L of the common power supply wiring 70 overlapped by the sealing member 400 may be reduced. Accordingly, when a thickness difference of the sealing member 400 occurs between an outer end of the common power supply wiring 70 and an area in which the common power supply wiring 70 overlaps the auxiliary power supply wiring 80, the width L of the common power supply wiring 70 overlapped by the sealing member 400 decreases, and thus, a decrease in the bonding strength of the sealing member 400 may be reduced or effectively prevented.

Figure 7:
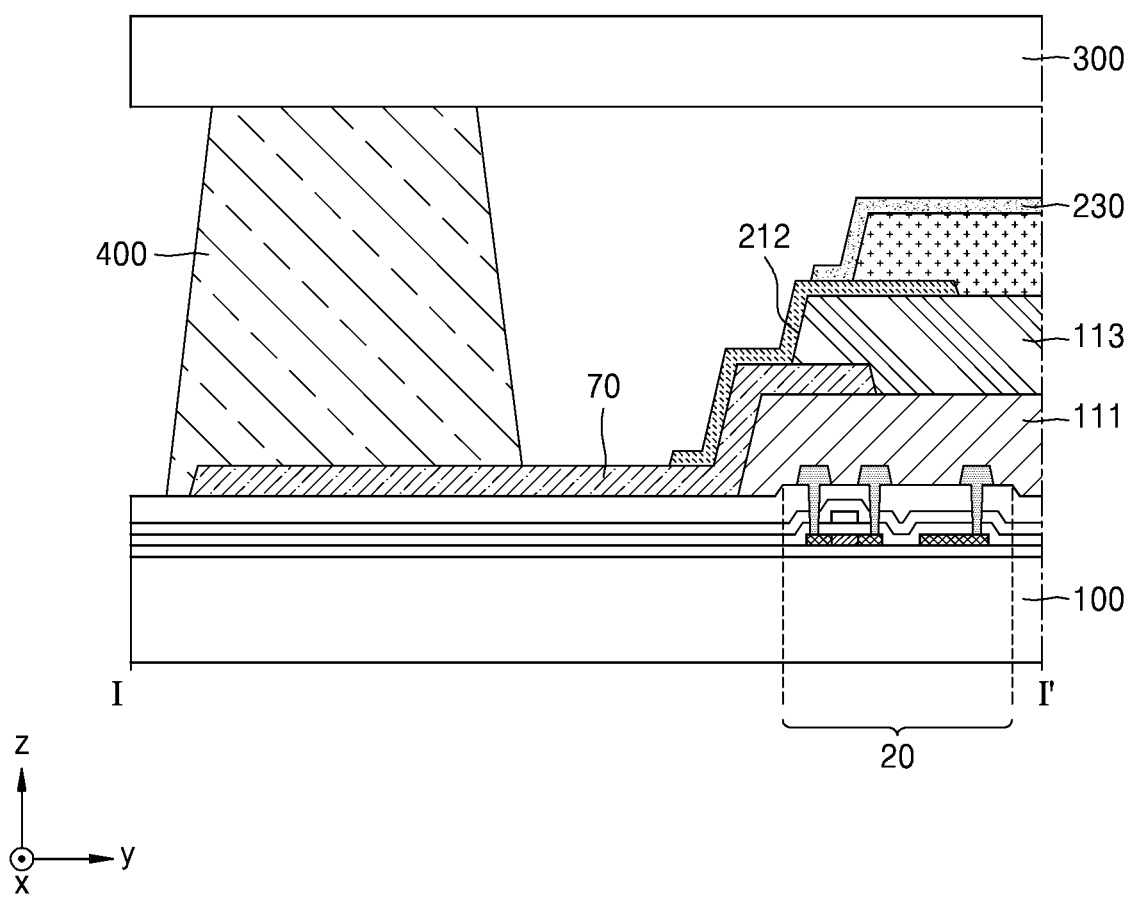
FIG. 7 is an enlarged cross-sectional view schematically illustrating yet another embodiment of the display apparatus taken along line I-I' shown in FIG. 1.

FIG. 7 is an enlarged cross-sectional view schematically illustrating yet another embodiment of the display apparatus along the line I-I' of FIG. 1.

Referring to FIG. 7, configurations that the substrate 100 and the encapsulation substrate 300 are bonded to each other by the sealing member 400, the outer end portion of the common power supply wiring 70 is covered by the sealing member 400, and a portion of the common power supply wiring 70 directly contacts the sealing member 400 is identical to the configurations illustrated and described with reference to FIG. 4.

FIG. 7 is different from FIG. 4 in that the common power supply wiring 70 extends towards the display area DA (see FIG. 1) and thus the inner end portion of the common power supply wiring 70 is located between the first organic insulating layer 111 and the second organic insulating layer 113. In other words, as the inner end portion of the common power supply wiring 70 is located on the first organic insulating layer 111, the common power supply wiring 70 may overlap a portion of the driving circuit 20.

Accordingly, as the width of the common power supply wiring 70 increases, an electrical resistance of the common power supply wiring 70 decreases and thus, a voltage drop of the common voltage ELVSS (see FIG. 2) applied to the common electrode 230 may be reduced or effectively prevented. In addition, the first organic insulating layer 111 is located between the driving circuit 20 and the common power supply wiring 70 overlapping the driving circuit 20. Thus, an electrical short circuit between the common power supply wiring 70 and another wiring included in the driving circuit 20 between the common power supply wiring 70 and the pixel circuit PC along the y-axis direction, may be efficiently reduced or effectively prevented.

Figure 8:
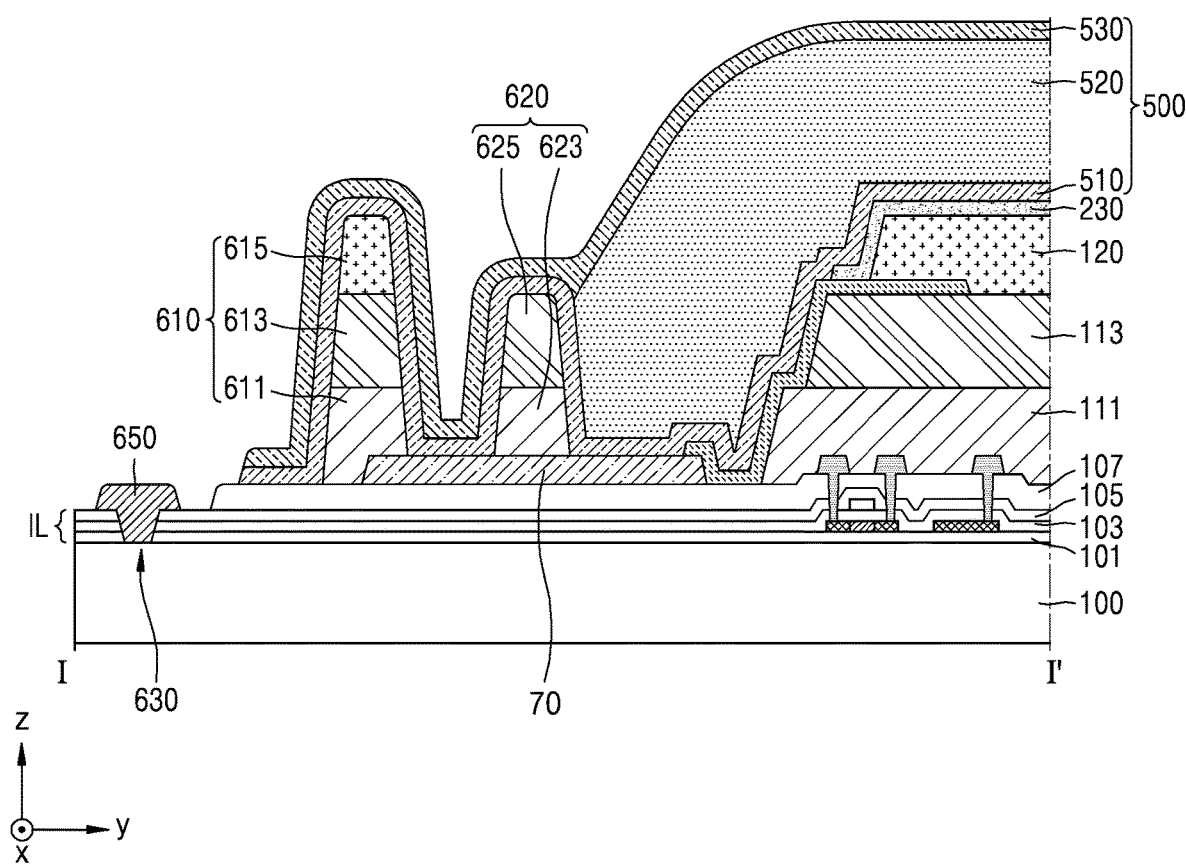
FIG. 8 is an enlarged cross-sectional view schematically illustrating yet another embodiment of the display apparatus taken along line I-I' shown in FIG. 1.

FIG. 8 is an enlarged cross-sectional view schematically illustrating yet another embodiment of the display apparatus along the line I-I' of FIG. 1. In FIG. 8, for convenience of explanation, descriptions overlapping those of FIG. 3 will be omitted, and only differences between FIGS. 3 and 8 will be described.

Referring to FIG. 8, the display apparatus 10 (see FIG. 1) may further include an encapsulation layer 500 on the common electrode 230.

The encapsulation layer 500 protects the display device 200 (see FIG. 3) from moisture or oxygen from outside the display device 200 and/or the display apparatus. To do so, the encapsulation layer 500 extends within the display area DA (see FIG. 1), in which the display device 200 (see FIG. 3) is located, toward the peripheral area PA (see FIG. 1) outside of the display area DA (see FIG. 1), to be disposed in the peripheral area PA. The encapsulation layer 500 may have a multi-layer structure. More particularly, as shown in FIG. 8, the encapsulation layer 500 may include a first inorganic encapsulation layer 510, an organic encapsulation layer 520, and a second inorganic encapsulation layer 530.

The first inorganic encapsulation layer 510, which is closest to and covers the common electrode 230, may include silicon oxide, silicon nitride, and/or silicon oxynitride. The above-mentioned first inorganic encapsulation layer 510 is disposed or formed to be extended along a profile of structures under the first inorganic encapsulation layer 510. Thus, as shown in FIG. 8, an upper surface of the first inorganic encapsulation layer 510 may not be smooth or flat.

The organic encapsulation layer 520 covers the first inorganic encapsulation layer 510 and has a thickness which does not follow the profile of structures under the organic encapsulation layer 520, such as to essentially planarize the first inorganic encapsulation layer 510 underlying the organic encapsulation layer 520 at the display area DA. Thus, an upper surface of the organic encapsulation layer 520 may substantially be smooth or flat over substantially an entire portion of the display area DA (see FIG. 1). The above-mentioned organic encapsulation layer 520 may include at least one of polyethylene terephthalate, polyethylene naphthalate, polycarbonate, polyimide, polyethylene sulfonate, polyoxymethylene, polyarylate, and hexamethyldisiloxane.

The second inorganic encapsulation layer 530, which covers the organic encapsulation layer 520, may include silicon oxide, silicon nitride, and/or silicon oxynitride. The second inorganic encapsulation layer 530 may extend further than an outer end of the organic encapsulation layer 520 to be disposed outside of the organic encapsulation layer 520 and contact the first inorganic encapsulation layer 510, thereby reducing or effectively preventing the organic encapsulation layer 520 from being exposed to outside the encapsulation layer 500.

As described above, the encapsulation layer 500 includes the first inorganic encapsulation layer 510, the organic encapsulation layer 520, and the second inorganic encapsulation layer 530. Due to this multi-layer structure, when a crack occurs in the encapsulation layer 500, the crack may not be connected between the first inorganic encapsulation layer 510 and the organic encapsulation layer 520 or between the organic encapsulation layer 520 and the second inorganic encapsulation layer 530. By doing so, formation of passages through which external moisture or oxygen permeates into the display area DA (see FIG. 1) may be reduced or effectively prevented.

In an embodiment of manufacturing a display apparatus, when forming the encapsulation layer 500, more particularly, the organic encapsulation layer 520, a material for forming the organic encapsulation layer 520 is limited to a preset area along the y-axis direction. To do so, as shown in FIG. 8, a first partition 610 may be located in the peripheral area PA (see FIG. 1). More particularly, as shown in FIG. 3, the first organic insulating layer 111 may be in the peripheral area PA (see FIG. 1) as well as the display area DA (see FIG. 1) of the substrate 100, and the first partition 610 is placed spaced apart from an outer end of the first organic insulating layer 111 at the driving circuit 20 and is further located in the peripheral area PA (see FIG. 1).

The first partition 610 may have a multi-layer structure. In an embodiment, for example, the first partition 610 may include a first layer 611, a second layer 613, and a third layer 615 in a direction along the thickness of the display apparatus 10 and away from the substrate 100. The first layer 611 may include a same material as that of the first organic insulating layer 111 and be simultaneously formed with the first organic insulating layer 111 such that the first layer 611 is in a same layer as the first organic insulating layer 111. The second layer 613 may include a same material as that of the second organic insulating layer 113 and be simultaneously formed with the second organic insulating layer 113 such that the second layer 613 is in a same layer as the second organic insulating layer 113. The third layer 615 may be additionally formed on the second layer 613 and include a same material as that of the second layer 613 such that the third layer 615 is in a same layer as the second layer 613. Alternatively, the third layer 615 may include a same material as that of the pixel defining layer 120 and be simultaneously formed with the pixel defining layer 120 such that the third layer 615 is in a same layer as the pixel defining layer 120.

As shown in FIG. 8, in addition to the first partition 610, a second partition 620 may also be located between the first partition 610 and the outer end of the first organic insulating layer 111. The second partition 620 may be located on the common power supply wiring 70. The second partition 620 is also placed spaced apart from the outer end of the first organic insulating layer 111 and located in the peripheral area PA (see FIG. 1). The second partition 620, which may have a multi-layer structure like the first partition 610, may include a smaller number of layers than layers of the first partition 610 so that a height of the second partition 620 taken along the thickness of the display apparatus 10 in a direction away from the substrate 100 is less than a height of the first partition 610 from the substrate 100. FIG. 8 illustrates the second partition 620 includes a lower layer 623, which may include a same material as that of the first layer 611 of the first partition 610 and be simultaneously formed with the first layer 611 of the first partition 610 such that the lower layer 623 is in a same layer as the first layer 611, and an upper layer 625 on the lower layer 623 that may include a same material as that of the second layer 613 of the first partition 610 and be simultaneously formed with the second layer 613 of the first partition 610 such that the upper layer 625 is in a same layer as the second layer 613.

Accordingly, in an embodiment of manufacturing a display apparatus, a location of the organic encapsulation layer 520 may first be limited or defined by the second partition 620 such that overflowing a material for forming the organic encapsulation layer 520 to outside of the second partition 620 in a process of forming the organic encapsulation layer 520 is reduced or effectively prevented. When the material for forming the organic encapsulation layer 520 partially overflows to outside of the second partition 620, the position of the organic encapsulation layer 520 may be further limited or defined by the first partition 610 such that flowing of the material for forming the organic encapsulation layer 520 further toward an outer edge of the substrate 100 is reduced or effectively prevented. As shown in FIG. 8, the first inorganic encapsulation layer 510 and the second inorganic encapsulation layer 530, which are formed by using a chemical vapor deposition method, cover the second partition 620 and the first partition 610 and terminate at a location outside of the first partition 610.

As shown in FIG. 8, a crack prevention member 630 may be located at the outside of the first partition 610. The crack prevention member 630 may extend along at least a portion of the outer edge of the substrate 100. A length of the crack prevention member 630 may extend along lengths defined by the outer edge of the substrate 100. In an embodiment, for example, the crack prevention member 630 may have a shape in a top-plan view that surrounds the display area DA (see FIG. 1). In some sections of the crack prevention member 630, the crack prevention member 630 may have a discontinuous shape defined by portions disconnected from each other along the length of the outer edge of the substrate 100.

A crack may occur in an inorganic material layer IL when a mother substrate is cut to separate portions thereof from each other which respectively define a display apparatus 10 during an embodiment of a process of manufacturing the display apparatus 10 (see FIG. 1) or when an impact is caused while using an individual one of the display apparatus 10 (see FIG. 1) which has already been separated from the mother substrate. As described above, the crack prevention member 630 may reduce or effectively prevent the crack from extending into the display area DA (see FIG. 1) from the peripheral area PA. Here, the inorganic material layer IL may be understood as including a collection of the buffer layer 101, the gate insulating layer 103, and the first interlayer insulating layer 105 that are stacked on the substrate 100. In embodiments, the inorganic material layer IL may include the second interlayer insulating layer 107.

The crack prevention member 630 may include a groove defined the inorganic material layer IL from which a portion of the inorganic material layer IL is removed. In addition, the crack prevention member 630 may be covered by a cover layer 650, as shown in FIG. 8. The cover layer 650 may, for example, include a same material as that of the first organic insulating layer 111 and be simultaneously formed with the first organic insulating layer 111 in the display area DA (see FIG. 1) such that the cover layer 650 is in a same layer as the first organic insulating layer 111. Alternatively, the cover layer 650 may include a same material as that of the second organic insulating layer 113 in the display area DA (see FIG. 1) and be simultaneously formed with the second organic insulating layer 113 such that the cover layer 650 is in a same layer as the second organic insulating layer 113. The first inorganic encapsulation layer 510 and the second inorganic encapsulation layer 530 of the encapsulation layer 500 do not extend to the crack prevention member 630. In other words, the crack prevention member 630 is not covered by the first inorganic encapsulation layer 510 and the second inorganic encapsulation layer 530, and an outer end portion of the first inorganic encapsulation layer 510 and an outer end portion of the second inorganic encapsulation layer 530 may respectively be located spaced apart from the crack prevention member 630 along the y-axis direction.

The common power supply wiring 70 may include a same material as that of the driving voltage line PL (see FIG. 3) located on the first organic insulating layer 111 in the display area DA (see FIG. 1) and be simultaneously formed with the driving voltage line PL (see FIG. 3). The emission driving circuit and scan driving circuit of the driving circuit 20, which are adjacent to the common power supply wiring 70 along the y-axis direction, are located at a lower portion of the first organic insulating layer 111. Accordingly, a short circuit between the common power supply wiring 70 and another wiring adjacent thereto, such as wiring included in the driving circuit 20 between the common power supply wiring 70 and the pixel circuit PC along the y-axis direction, may be reduced or efficiently prevented.

FIG. 8 illustrates an example in which the common power supply wiring 70 has a same structure as the structure shown in FIG. 3, however, the present disclosure is not limited thereto. In the embodiment shown in FIG. 8, in which the encapsulation layer 500 is further provided on the common electrode 230, the common power supply wiring 70 may have a configuration shown and described in one or more embodiment shown in FIGS. 5 through 7.

According to one or more embodiment of the display apparatus of the present disclosure, the peripheral area may be reduced while an electrical short circuit between wirings adjacent to each other along a substrate may be reduced or effectively prevented. However, the scope of the present disclosure is not limited to the above-mentioned advantages.

It should be understood that embodiments described herein will be considered in a descriptive sense only and not for purposes of limitation. Descriptions of features within each embodiment will typically be considered as available for other similar features in other embodiments.

While one or more embodiments have been described with reference to the figures, it will be understood by those of ordinary skill in the art that various changes in forms and details may be made therein without departing from the spirit and scope as defined by the following claims.

What is claimed is:

1. A display apparatus comprising:
a substrate comprising a display area and a peripheral area which is adjacent to the display area;
a first organic insulating layer and a second organic insulating layer each on the substrate;
in the display area:
a thin film transistor on the substrate;
a driving voltage line electrically connected to the thin film transistor, the driving voltage line between the first organic insulating layer and second organic insulating layer; and
a display device electrically connected to the thin film transistor, the first organic insulating layer and the second organic insulating layer between the display device and the thin film transistor; and
in the peripheral area, a common power supply wiring on the substrate and through which a common voltage is supplied to the display device in the display area,
wherein the common power supply wiring in the peripheral area and the driving voltage line in the display area are respectively portions of a same first material layer on the substrate.

2. The display apparatus of claim 1, further comprising in the peripheral area, a driving circuit which is on the substrate and drives the display area, the driving circuit between the substrate and the first organic insulating layer.

3. The display apparatus of claim 2, wherein in the peripheral area, an inner end portion of the common power supply wiring is closest to the display area and is between the first organic insulating layer and the second organic insulating layer.

4. The display apparatus of claim 3, wherein in the peripheral area, the driving circuit is disposed between the substrate and the inner end portion of the common power supply wiring.

5. The display apparatus of claim 1, further comprising:
an encapsulation substrate arranged to face the substrate; and
a sealing member in the peripheral area, the sealing member between the substrate and the encapsulation substrate,
wherein in the peripheral area, an outer end portion of the common power supply wiring is furthest from the display area and disposed between the substrate and the sealing member.

6. The display apparatus of claim 1, further comprising in the peripheral area, an auxiliary power supply wiring electrically connected to the common power supply wiring, the auxiliary power supply wiring between the substrate and the common power supply wiring.

7. The display apparatus of claim 6, further comprising in the display area, a data line between the substrate and the first organic insulating layer,
wherein the auxiliary power supply wiring and the data line are respectively portions of a same second material layer on the substrate, the second material layer being different than the first material layer.

8. The display apparatus of claim 6, wherein in the peripheral area,
the auxiliary power supply wiring between the substrate and the common power supply wiring comprises:
an inner end portion of the auxiliary power supply wiring which is closest to the display area, and
an outer end portion of the auxiliary power supply wiring which is furthest from the display area, and
the common power supply wiring extends further than each of the inner end portion and the outer end portion of the auxiliary power supply wiring to cover the auxiliary power supply wiring.

9. The display apparatus of claim 6, further comprising:
an encapsulation substrate arranged to face the substrate; and
a sealing member in the peripheral area, the sealing member between the substrate and the encapsulation substrate,
wherein in the peripheral area,
an outer end portion of the common power supply wiring is furthest from the display area and disposed between the substrate and the sealing member to directly contact the sealing member, and
along a direction from the peripheral area to the display area, an entirety of the auxiliary power supply wiring is between the sealing member and the display area.

10. The display apparatus of claim 1, further comprising in the display area, a first inorganic encapsulation layer, a second inorganic encapsulation layer, and an organic encapsulation layer which is between the first inorganic encapsulation layer and the second inorganic encapsulation layer,
wherein the first inorganic encapsulation layer and the second inorganic encapsulation layer each extend from the display area to dispose outer end portions of the first inorganic encapsulation layer and the second inorganic encapsulation layer, respectively, in the peripheral area and in contact with each other.

11. The display apparatus of claim 10, further comprising in the peripheral area,
an outer end portion of the first organic insulating layer which is furthest from the display area, and
a first partition on the substrate and spaced apart from the outer end portion of the first organic insulating layer,
wherein along a direction from the peripheral area to the display area, the outer end portion of the first inorganic encapsulation layer and the outer end portion of the second inorganic encapsulation layer are disposed further from the display area than the first partition.

12. A display apparatus comprising:
a substrate comprising a display area and a peripheral area which is adjacent to the display area;

an organic insulating layer on the substrate in each of the display area and the peripheral area thereof;

in the display area:
- an organic light-emitting device on the substrate, and
- a pixel circuit which is on the substrate, the pixel circuit comprising a wiring which is electrically connected to the organic light-emitting device; and in the peripheral area:
- a common power supply wiring on the substrate and through which a common voltage is applied to the organic light-emitting device in the display area; and
- a driving circuit which is on the substrate and drives the display area, the driving circuit between the common power supply wiring and the pixel circuit along a direction from the peripheral area to the display area, wherein
in the peripheral area, the driving circuit is between the substrate and the organic insulating layer, and
the common power supply wiring in the peripheral area and the wiring of the pixel circuit in the display area, are respectively portions of a same first material layer on the substrate.

13. The display apparatus of claim 12, wherein in the peripheral area,
an inner end portion of the common power supply wiring is closest to the display area, and
the organic insulating layer is between the substrate and the inner end portion of the common power supply wiring.

14. The display apparatus of claim 13, wherein in the peripheral area, the driving circuit is disposed between the substrate and the inner end portion of the common power supply wiring.

15. The display apparatus of claim 12, further comprising:
an encapsulation substrate arranged to face the substrate; and
a sealing member in the peripheral area, the sealing member between the substrate and the encapsulation substrate,
wherein in the peripheral area, an outer end portion of the common power supply wiring is furthest from the display area and disposed between the substrate and the sealing member.

16. The display apparatus of claim 15, further comprising in the peripheral area, an auxiliary power supply wiring electrically connected to the common power supply wiring, the auxiliary power supply wiring between the substrate and the common power supply wiring.

17. The display apparatus of claim 16, wherein
the driving circuit comprises a thin film transistor including a source electrode and a drain electrode each in the display area, and
the source electrode in the display area, the drain electrode in the display area and the auxiliary power supply wiring in the peripheral area are respectively portions of a same second material layer on the substrate, the second material layer being different than the first material layer.

18. The display apparatus of claim 16, wherein in the peripheral area, along the direction from the peripheral area to the display area, an entirety of the auxiliary power supply wiring is between the sealing member and the display area.

19. The display apparatus of claim 12, further comprising in the display area, a first inorganic encapsulation layer, a second inorganic encapsulation layer, and an organic encapsulation layer which is between the first inorganic encapsulation layer and the second inorganic encapsulation layer,
wherein the first inorganic encapsulation layer and the second inorganic encapsulation layer each extend from the display area to dispose outer end portions of the first inorganic encapsulation layer and the second inorganic encapsulation layer, respectively, in the peripheral area and in contact with each other.

20. The display apparatus of claim 19, further comprising in the peripheral area,
an outer end portion of the organic insulating layer which is furthest from the display area, and
a first partition on the substrate and spaced apart from the outer end portion of the organic insulating layer,
wherein along the direction from the peripheral area to the display area, the outer end portion of the first inorganic encapsulation layer and the outer end portion of the second inorganic encapsulation layer are disposed further from the display area than the first partition.

* * * * *